(12) United States Patent
Cannon et al.

(10) Patent No.: US 7,853,846 B2
(45) Date of Patent: Dec. 14, 2010

(54) LOCATING HOLD TIME VIOLATIONS IN SCAN CHAINS BY GENERATING PATTERNS ON ATE

(75) Inventors: Stephen A. Cannon, Fremont, CA (US); Richard C. Dokken, San Ramon, CA (US); Alfred L. Crouch, Cedar Park, TX (US); Gary A. Winblad, Dublin, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 189 days.

(21) Appl. No.: 11/931,847

(22) Filed: Oct. 31, 2007

(65) Prior Publication Data

US 2009/0113265 A1 Apr. 30, 2009

(51) Int. Cl.
*G01R 31/28* (2006.01)
(52) U.S. Cl. .................. 714/726; 714/715; 714/724; 714/727; 714/728; 714/729; 714/8; 714/25; 714/30; 714/32; 714/719; 714/720; 714/735; 714/818; 714/824; 716/4
(58) Field of Classification Search .................. None
See application file for complete search history.

(56) References Cited

U.S. PATENT DOCUMENTS

| | | | |
|---|---|---|---|
| 3,783,254 A | 1/1974 | Eichelberger | |
| 4,293,919 A | 10/1981 | Dasgupta et al. | |
| 6,516,432 B1 * | 2/2003 | Motika et al. | 714/732 |
| 6,584,591 B1 | 6/2003 | Taylor | |
| 7,058,869 B2 * | 6/2006 | Abdel-Hafez et al. | 714/729 |
| 7,107,502 B2 | 9/2006 | Burdine | |
| 7,225,374 B2 * | 5/2007 | Burdine et al. | 714/726 |
| 7,234,090 B2 | 6/2007 | Blasi et al. | |
| 7,395,470 B2 * | 7/2008 | Burdine et al. | 714/726 |
| 2005/0172188 A1 * | 8/2005 | Burdine | 714/726 |
| 2005/0235186 A1 * | 10/2005 | Wang et al. | 714/728 |
| 2007/0220381 A1 * | 9/2007 | Huang et al. | 714/724 |
| 2008/0040637 A1 * | 2/2008 | Huang et al. | 714/729 |
| 2008/0141085 A1 * | 6/2008 | Dokken et al. | 714/726 |
| 2008/0250284 A1 * | 10/2008 | Guo et al. | 714/726 |

OTHER PUBLICATIONS

Storey, T.M, et al., "Delay Test Simulation", IBM System Products Division, East Fishkill, Hopewell Junction, New York, 12533, pp. 492-494.

International Search Report and Written Opinion for International Application No. PCT/US08/82088 mailed on Feb. 13, 2009.

* cited by examiner

*Primary Examiner*—John P Trimmings
(74) *Attorney, Agent, or Firm*—Holland & Hart, LLP

(57) ABSTRACT

A method for determining that failures in semiconductor test are due to a defect potentially causing a hold time violation in a scan cell in a scan chain, counting the number of potential defects, and, if possible, localizing, and ameliorating hold time defects in a scan chain.

6 Claims, 3 Drawing Sheets

LOCATING HOLD TIME VIOLATIONS IN SCAN CHAINS BY GENERATING PATTERNS ON ATE

BACKGROUND

As technology nodes shrink, more defects are found in the scan chain circuitry added for the purpose of test. This is due to a number of reasons as described in this document. To bring new integrated circuits to market, and ramp yield to acceptable levels, identifying these defects and learning trends is critical, but can be costly without new approaches.

Scan Basics

Scan Chains are critical needed items for test and yield-bring-up; when they break they both relegate the chip under test to the fail bin (adding to the yield loss problem) and they may mask and prevent timely and accurate evaluation of other fails sourcing from combinational, sequential, power-distribution or clock logic. This criticality requires that it is first necessary to provide some background on established techniques of SCAN in semiconductor test. The approach of scan methodology is to replace all flip-flops in a design with scan flip-flops. Scan flip-flops provide two paths into each flip-flop: one for the mission of the design, and a second to facilitate test.

Scan Flip-Flops

There are two most common methods of implementation today:

MUXD—This scan flip-flop approach places a multiplexer (mux) on the front end of the D-input. The selector to the mux, known as the scan enable, determines whether to use the mission mode input or the scan test input.

LSSD—Another common scan flip-flop approach is to use multiple non-overlapping clocks: one pair operates the separated Master and Slave latches for mission data; the other pair operates the separated Master and Slave latches to produce the scan shift operation. The total scan shift and sample operation may be conducted with just one pair of clocks or with a combination of all of the clocks.

Scan Chains—By stitching all of the scan flip-flops, or scan cells, together into one or more shift registers called scan chains, each flip-flop can be preset or observed. This allows for test patterns to be constructed that will concentrate on finding faults in mini sub-circuits.

Further descriptive commentary will focus on the MUXD type scan since it is easier and simpler to describe. Each scan flip-flop has two input paths as controlled by a mux on the input. When the scan enable "SE" is asserted, the scan chain operates as a shift register. This allows for each flip-flop to be set to a specific state. It also allows for the observation of each flip-flop state as the values are shifted out of the device onto the scan output "SO". Level Sensitive Scan Design is disclosed by Eichelberger et al. in 14$^{th}$ Design Automation Conference Proceedings June 1977, pp 492-494 and in U.S. Pat. Nos. 3,783,254 and 4,293,919.

Current Defect Models for Scan Chains: Blocked, Bridging, Hold-Time.

Defects in scan chains are becoming more common as technology nodes shrink and as the number of flip-flops per design increase. Problems often result in scan chains as scan interconnects are routed later to avoid interfering with the mission critical routing.

There are several generally accepted models for defects in scan chains: blocked chains, bridging, and hold time.

Blocked Chains—This condition is determined by observing the scan outputs while in scan mode. If the output is at a fixed level regardless of the data shifted into the chain, the chain is blocked at one or more points, the block nearest to the scan data output dominates what is observed from that chain. The fault model is generally that the output of the scan chain is either stuck-at-0 or stuck-at-1 from the sequential element located at the point of the break.

Bridging—Bridging faults are a condition of data dependency when data passing through one scan chain can modify data in another scan chain or in a different location in the same scan chain. The suspected mechanism is an "aggressor-victim" short or bridge that is exercised when the two signals involved are at opposite values.

Hold-Time—Hold-Time faults are a condition that allows the data from one flip-flop to race forward in the chain. Hold time faults are attributed to a number of factors including long wire routes as compared to Clock to Q times of flip-flops or clock skew. This condition is suspected when data produced on the output is still toggling but seems skewed (correct response but shifted over in time) or that bits are missing (data smearing or bit skipping). On the overall, Hold-Time Violations can be viewed as "accidental encryption". If the number of bits applied into the scan input does not match the data on the scan output, it is likely that a hold-time problem exists. In some cases hold time violations make the scan chain appear to have fewer flip flops than it actually has.

Hold time is a data communication fault between two adjacent cells in a scan chain the bit closest to scan in is the aggressor cell and the bit closest to scan out is the victim cell. When a hold time violation exists the victim cells data is replaced with the aggressor cell's data value. The resultant data stream shows the aggressor's data twice and the victim's data is lost. There are three common types of hold time.

A) Standard hold time—both data states are improperly communicated, resulting in a fail signature that simulates a missing flip flop in the chain.

B) Data One hold time—When the aggressor cells data is a one, its data is pulled forward one location overwriting the victim's data. The resultant fail signature has too many ones.

C) Data Zero hold time—When the aggressor cells data is a zero, its data is pulled forward one location overwriting the victim's data. The resultant fail signature has too many Zeros.

Testing the Scan Chains—Typically, to insure that the scan chain test logic is operational, tests will be performed on it prior to the functional logic (Scan Chain Integrity Tests). The most common approach is to send a series of 1's and 0's at the Scan Inputs (SI). With the Scan Enable (SE) asserted, the scan chain is essentially a big shift register. With the continued assertion of the Scan Enable (SE), the functional logic is removed from the test. After 'n' number of clock cycles, where 'n' equals the number of scan cells in the chain, the input stream should be observed on the Scan Output (SO).

The Problem: Data Transfer in the Scan Chain (Hold Time)

If the scan chain does not transfer data from the input to the output reliably, the entire scan methodology is lost. Input data to load the chain and output data to unload the chain are both disrupted. This typically manifests itself as a scan chain integrity failure. This makes the scan chain appear to be shorter than it actually is by at least one flop. The clock skew issue can be caused by design issues such as timing closure or manufacturing defects such as faulty vias or weak clock-tree buffers. In nanometer geometries, it is often caused by a combination of the two causing a yield loss due to hold time issues.

Conventional chain integrity patterns produced by ATPG tools today are implemented as a replicated stream of a '0-0-1-1-0-0-1-1' sequence. This sequence has data changing on every other vector. Therefore a device with a standard hold time violation appears to be shifted by one bit and the last bit is indeterminate. The last bit that is shifted out is not part of the pattern; it is the state that was on the scan in pin when the scan out sequence was applied.

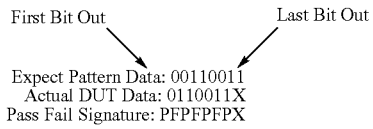

Note that the fail signature with a single standard hold time violation is basically pass fail pass fail.

Often these failures are timing sensitive. Since the rise time and fall time of the Q outputs are not symmetrical, these failures may result in the ability to transfer one data state but not the other. This failure could be caused by the Q-output having a slower to rise time than a fall time.

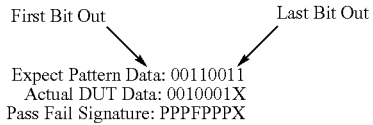

The examples above assume a single hold time violation with 0 being the aggressor state and 1 being the victim state. When devices have multiple hold time violations on a single chain the data shifts one cycle for each violation. It is quite common for smaller geometry devices to have multiple hold time violations on a single chain. With the standard 00110011 pattern it is possible for a chain to shift the data 4 positions and at the end of the pattern actually be passing the scan chain test. More exhaustive patterns with a consistent background pattern are required to diagnose and localize hold time failure mechanisms. ATPG tools alone may not be able to localize these problems because they are dependent upon integrity in the scan chains to perform diagnosis.

Functional Tester Background—Historically, testers apply a set of pre-determined and simulated stimulus, and validate that the response on the device outputs match the results expected from the simulation. Functional testers are designed to report in a go/no-go fashion that all of the outputs matched the expected results for all checked strobe points or not. Functional testers are not architected to understand design criteria of the device under test such as the scan structures. Thus, while testers can understand which output signals contained failures, each output signal can represent tens of thousands of internal scan cells.

Voltage Sensitivity of hold time—In some cases changing the core voltage on the device can change the internal timings enough to create or eliminate a hold time issue. Experimentation by the inventors has shown that raising the voltage will often allow the scan chain to pass. In this document the voltage that makes a scan chain pass is referred to as the safe voltage. The targeted voltage is referred to as the spec voltage. Temperature can also affect the internal timings and contribute to the safe operation.

A Problem with Scan Chains:

In design for test methodology, flip flops or registers have a dual functionality. During normal or functional mode, they latch data states in the circuit and store values to be transmitted to the next cloud of logic in the design. During the test mode, the registers are used to provide test stimulus to the combinational logic, and capture the results of the logic operation. To transfer the test patterns into and out of the device under test, the registers are reconfigured as several serial shift registers.

A design problem known as setup violations can occur if the amount of logic between two banks of registers is so great that the data does not propagate through the logic and become stable at the input to a register with the sufficient setup time required before the register is clocked. The result clocked into the register may be invalid. This is solved by design methodologies and tools associated with the term timing analysis.

After the desired state is loaded into the scan chains, scan enable is not asserted and the logic is clocked one or more times in mission mode. The result of the logic operation is captured in the flip flops. It is desirable to bring this result out of the device under test so they can be examined by the tester. After putting the registers back into serial shift mode, enough clocks are applied to shift every bit in the scan chain out of the scan out port. Most designs have some scan chains longer than others. It is important to shift the data enough times for even the longest scan chain to be fully unloaded. Shorter chains are over shifted and therefore get padded with X (don't care) states. This same technique is applied when data is shifted in where shorter chains are typically pre-padded with dummy 0 data before the actual data stream.

At this time it is common to shift a new test pattern in through the scan in port.

Several defects can frustrate this operation and must be detected, analyzed, and reported. If the scan path is blocked at some point, not all the test pattern will reach its intended registers to stimulate the logic, and of the data that is captured into registers, not all of the output pattern will be emitted from the scan out port.

In conventional implementations of scan registers, charge flow or current is required to establish a clock event as well as state change. A defect in the conductive medium may lower the rate of current so that a state change or a clock event may be delayed from its desired time. Furthermore clock signals must be distributed throughout a chip and require buffers to boost current. Any two clock signals may have a difference in arrival at their register which is called clock skew and which can be managed by adjusting the buffer size and the routing of the wires carrying the clock signal.

Hold time faults model some defect that causes a clock to be delayed to the point that the register latches the same value as the register which precedes it. In some cases the input is transitioning to a new state in which case the data value captured is invalid. In the experience of those skilled in the art of testing it has been observed that a change of state from one to zero or zero to one is more likely to be involved in a hold time fault but with unequal likelihood.

As an example consider a scan chain of length 8 with bit zero closest to the scan out port and bit 7 closest to the scan in port.

After a functional clock, the state of the logic is entirely captured within the 8 registers

V(0) V(1) V(2) V(3) V(4) V(5) V(6) V(7)

In a correct shift register, each of the 8 bits is serially shifted out and a new test pattern beginning with I(0) is shifted in.

But imagine that one of the flip flops exhibits a hold time defect:

On the first shift clock V(0) is emitted from the scan out port.

A defect on bit 6 in the chain causes it to capture V(7) rather than V(6).

Continuing this shift the last flop might capture the state of the preceding flop.

At the end of shifting 8 clocks the scan out will have received

V(0) V(1) V(2) V(3) V(4) V(5) V(7) I(0)

Meanwhile the input test pattern will also have been corrupted:

I(0) I(1) I(2) I(3) I(4) I(5) I(7) I(N)

It may be appreciated that scan chains may be conventionally comprised of 10,000 registers and that even if less than 1 percent exhibit a hold time fault it may be hundreds of bits that have been invalidated. It can be further appreciated that hold time faults may operate statistically rather than ideally and that the probability of a fault affecting a zero-one transition may differ from the probability of a fault affecting a one-zero transition.

To an observer at the scan out port it may appear that the scan chain has been shortened by one bit for each defect and that one bit is simply missing.

Thus it can be appreciated that what is needed is a method to determine if a scan register exhibits hold time defect behavior, determine the number of potential hold time defects in a scan registers, and if possible locate the hold time defects within a scan register.

SUMMARY OF THE INVENTION

Applying a pattern at the input of a scan chain and counting the number of clocks before the pattern is observed at the output of the scan chain. Determining a safe voltage to load and unload a scan chain. Applying a pattern which forces transitions at every bit of the scan chain and allows for the detection of those patterns at the output. Altering the number of clocks and utilizing fault bit processing to ameliorate a hold time defect in a scan chain. Real time generation of these patterns is most efficient and eliminates the burden on pattern memory. Part of our invention is to apply a background state during pre padded input cycles.

DETAILED DESCRIPTION

Figure 1:
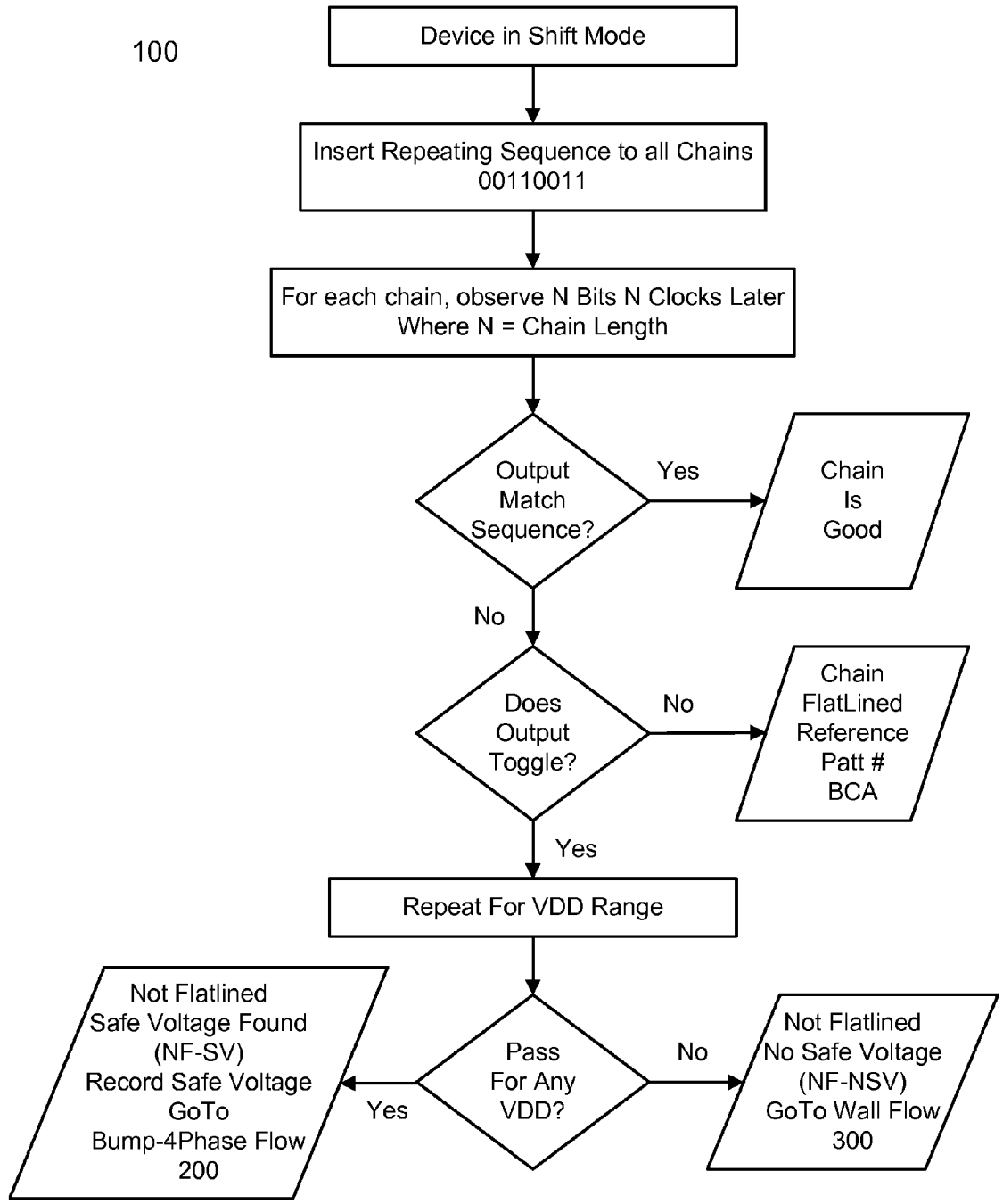
FIG. 1 is a flowchart of an embodiment of the invention.
Figure 2:
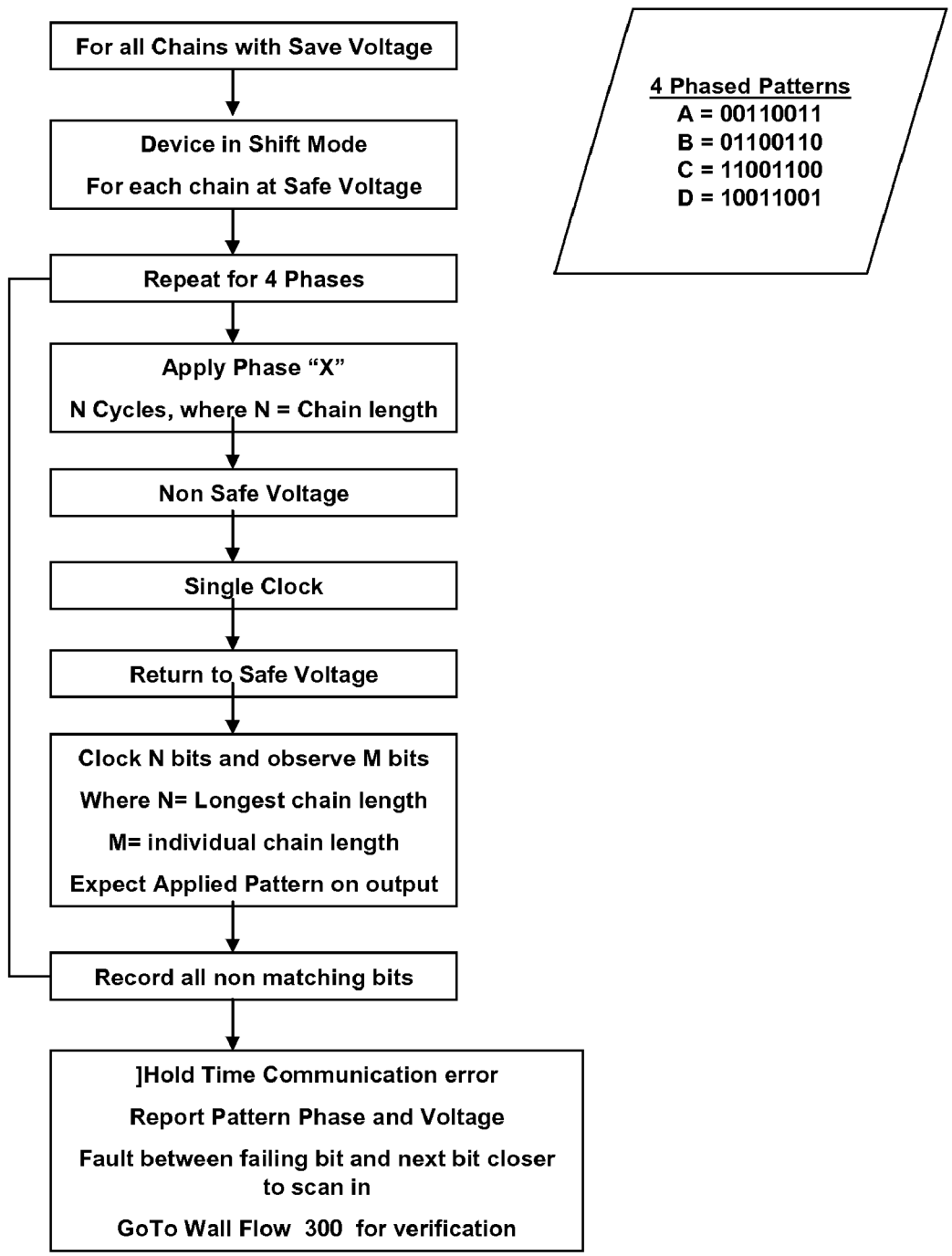
FIG. 2 is a flowchart of an embodiment of the method of localizing a defect.
Figure 3:
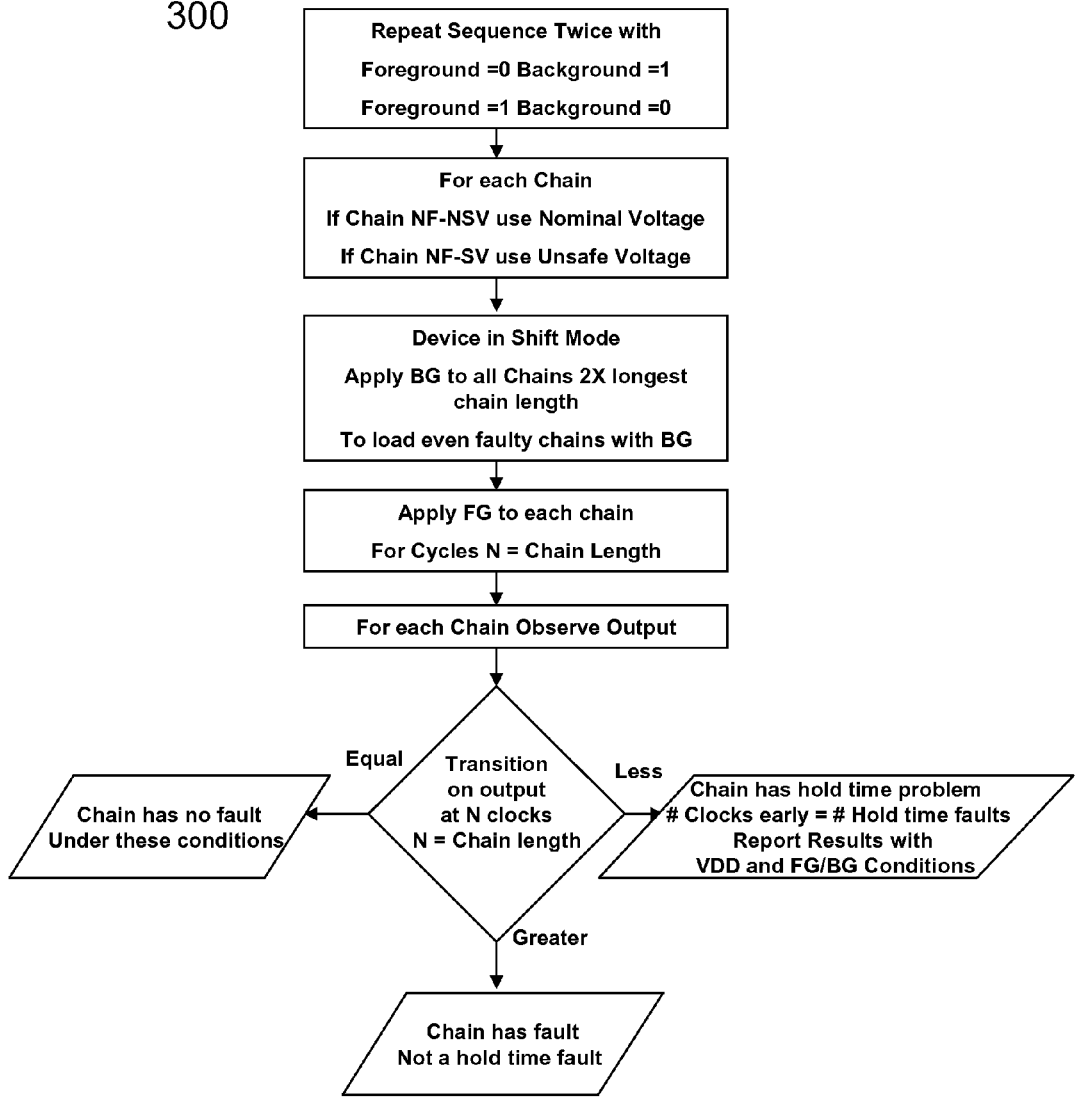
FIG. 3 is a flowchart of an embodiment of the method of counting defects.

The present invention creates a real-time interpretative Scan Pattern on the fly. This invention includes a software architecture which recognizes the scan chain integrity pattern from the ATPG generated pattern deck and can write new data patterns according to the DUT output stimulus. To apply proper background patterns the scan structures must be understood including unbalanced scan chains. When a failure occurs, the controlling software process recognizes the failure is in the chain test, applies algorithms to determine if the fail signature is applicable for hold time analysis and applies patterns to efficiently find the number of hold time violations in each chain. If a safe voltage is determined the location of each of the hold time violations in each chain is identified.

Finding a "Safe" operating voltage for the device can be very helpful for finding out what bit in the scan chain has the hold time violation. To find the safe voltage, vary the voltage around the spec starting with a lower voltage and moving to a higher voltage. For each step monitor the scan chain output noting where the output most closely matches the input sequence. Move through this voltage and check for stability. Sufficient resolution should be used to insure that the chain is working properly and repeatable.

Once a safe voltage is found it can be used to identify the locations of the hold time faults. Load the scan chain at the safe voltage, clock the device for one or more cycles at the spec voltage and then bring the device back to the safe voltage for scan out. Some of the key contributors to making this technique efficient are for the operating system to understand the load and unload portions of the pattern, be able to apply a background pattern surrounding the data pattern. Having a pattern controlled power supply that can switch between the safe and spec voltages under pattern control is also very useful.

In order to qualify as a good candidate for hold time violation the scan chain pattern must fail and the output must not be flat lined (always low or high). The output should be stable (repeatable). As new data will be shifted into the scan chain during the unload, the present invention introduces the concept of the background pattern. Since scan chains with hold time violations cannot be loaded or unloaded reliably when the data is changing and the scan chain length appears to be inconsistent, it is a distinguishing aspect of the present invention to apply a background state surrounding the data pattern being applied.

In an embodiment, the invention comprises a method for determining the number of scan cells in a scan chain having a defect causing a hold time violation the method comprising:

setting an environmental variable to a value determined to cause a potential hold time violation;

applying a pattern of 2n ones, 2n zeroes and n ones wherein n is the length of the scan chain:

observing the output of the scan chain and comparing the number of clocks to the number of bits between transitions, whereby the number of hold time problems is equal to the number of clocks a transition occurs before n wherein n is the length of the scan chain.

An embodiment of the method for finding the safe operating range if one exists:

Test each scan chain in the device individually.

Load a background state of all 0.

This state is applied to the device for 2× the scan chain length. This insures a complete wash of the scan chain. The normal 00110011 pattern is loaded at the safe voltage and then unloaded. This can be run recursively in a loop much like a search to find a passing or "Safe" voltage. Each chain can have a slightly different safe voltage. If a safe voltage exits for any chain, the actual hold time violation cell will be analyzed.

Load a background state of all 0.

This state is applied to the device for 2× the scan chain length. This insures a complete wash of the scan chain. The normal 00110011 pattern is loaded at the safe voltage. Next the core supply is taken to the spec voltage for one shift cycle and then returned to the safe voltage for the unload. Since one additional clock was applied between the normal load/unload sequence all output patterns must be reduced by one bit. This is due to the fact that the unload operation has been executed for one cycle. Bit zero has been sifted out during this operation.

Loaded pattern: 00110011

Expected pattern: 0110011

Since hold time detection is dependent on the data content it is important to have each cell at a 0 followed by a 0, 0 followed by a 1, 1 followed by a 0 and
1 followed by a 1.

This can efficiently be done by shifting the input pattern by one bit each time and applying a pattern phase shifted a total of four times.

First Pass (Loaded Pattern Normal Phase)
Loaded pattern: 00110011
Expected pattern: 0110011
Second Pass (Loaded Pattern Shifted One Location)
Loaded pattern: 01100110
Expected pattern: 1100110
Third Pass (Loaded Pattern Shifted Two Locations)
Loaded pattern: 11001100
Expected pattern: 1001100
Fourth Pass (Loaded Pattern Shifted Three Locations)
Loaded pattern: 10011001
Expected pattern: 0011001

With at least four passes through the chain integrity pattern every transition combination can be tested at every cell.

The hold time violations can now be extracted by examining the output data. Since the data is being shifted out at a safe voltage, a failing bit indicates the mis-transfer of data during the single clock cycle at the unsafe voltage. On the test pass where the victim's and the aggressor's data is not the same, the victim cell will fail. The aggressor's data will be observed instead of the victim's data. It is sometimes helpful to apply short data sequences to the specific areas where hold time violations are detected. For instance a background of 0 with a single foreground vector of 1000010000 pattern walked though an area of the pattern can detect data sensitivities.

An embodiment of the method for finding the existence and number of hold time issues without a safe voltage:

If no safe voltage can be found for the chain:
Load a background state of all 0. This state is applied to the device for 2× the scan chain length. This insures a complete wash of the scan chain.

Now walk a wall of foreground ones through the background of zeros. The foreground pattern should appear on the scan out after exactly the scan chain length number of clock cycles. Each cycle the pattern is detected early indicates a hold time violation. This technique works well because no matter how many hold time violations are encountered the wall of foreground is propagated throughout the chain.

This technique is repeated with a background of 1 and a foreground of 0.

The present invention is a method for verifying and analyzing scan chain integrity in a device under test comprising the processes of
determining that a scan chain exhibits hold time fault behavior;
determining a voltage at which a scan chain does not exhibit hold time fault behavior, and
applying patterns to localize a hold time fault in a scan chain.

The invention further comprises a method for detecting, analyzing, and counting at least one hold time fault in a scan chain within a device under test comprising
determining if a scan chain is blocked;
determining if a scan chain has a hold time fault;
counting the number of possible hold time faults in a scan chain;

The method further comprises computing a validating hold time fault test pattern. In the present invention we define fault bit processing to anticipate a fault's propensity to pull data forward in the chain and possibly reduce the required clocks to load a chain. If the number and location of hold time defects could be determined, fault bit processing comprises modifying the input pattern, altering the number of clocks, and inserting X's into the output data stream to ameliorate the problem.

The method further comprises determining a safe voltage to successfully operate a scan chain. Higher voltage provides higher current and potentially enables a register to overcome a defect which causes a hold time fault at a lower voltage. Reapplying a positive pulse and a negative pulse while counting the clocks and sweeping the supply voltage upward would determine a safe voltage. The voltage where pulses are observed at the scan out port at exactly the number of clocks equal to the scan chain length is the safe voltage. Note that some faults in the chain may have a safe voltage while others do not. A combination of fault bit processing and safe voltage searching will allow a known state to be loaded into the chain.

The method further comprises reporting the potential number of hold time faults in a scan chain. Some defects may be exhibited by one to zero transitions and some defects exhibited by zero to one transitions. Some defects may only be exhibited statistically. If a pattern shifted through a shift register of length n emerges exactly after n clocks, it indicates that there are no hold time violations at this voltage. If no pattern emerges after n clocks, it indicates that this is a candidate for further blocked chain analysis. If a pattern, possibly corrupted, emerges earlier than n clocks, the number of clocks early indicates a potential number of hold time faults.

A method for detecting, analyzing, and localizing a hold time fault in a scan chain within a device under test which has a safe voltage comprising
applying a first localizing test pattern;
applying a second localizing test pattern;
applying a third localizing test pattern;
applying a fourth localizing test pattern; and
observing an output pattern to detect if at least one bit has been omitted.

One embodiment of localizing test patterns is recurring hexadecimal 3's, 6's, C's, and 9's. The point of which is to applying first a rising and then a falling transition to every bit. It can also be accomplished by serially shifting seven's through the input pattern generator. In all cases, the observation is to check if every pair or triad of ones or of zeros has been successfully propagated to the scan output. If the eight or more defects have been counted, then patterns that are larger than hexadecimal such as double byte are required for localization.

The invention further comprises applying a validating localization test pattern. This requires removing a clock for each bit which was moved forward. The method further comprises reporting the location in a scan chain of at least one hold time fault. If there are many hold time faults it may suggest redesign or at least failure analysis. However adjusting input scan patterns automatically and adjusting the number of scan clocks may provide sufficient amelioration for getting patterns in. If localization is successful, one may insert X's or question marks into the test log for bits lost due to hold time faults.

The invention is a method for detecting, analyzing, and localizing a hold time fault in a scan chain within a device under test comprising
determining if a scan chain is blocked;
by shifting a positive pulse and a negative pulse through a scan chain with more than n clocks where n is the scan chain length,
determining if a scan chain has a hold time fault;
by observing a test pattern shifted through a scan chain in less than n clocks, counting the number of possible hold time faults in a scan chain;

by subtracting the number clocks necessary to shift a pattern from the length of the scan chain, computing a validating hold time fault test pattern by using Fault Bit Processing, determining a safe voltage to successfully operate a scan chain;

by sweeping the voltage until the pattern input equals the pattern output, applying a first localizing test pattern;

embodied as recurring hexadecimal 3's or equivalent, applying a second localizing test pattern;

embodied as recurring hexadecimal 6's or equivalent, applying a third localizing test pattern;

embodied as recurring hexadecimal c's or equivalent, applying a fourth localizing test pattern;

embodied as recurring hexadecimal 9's or equivalent, applying a validating localization test pattern; and by adjusting the number of clock cycles by the number of defects.

The invention further comprises, in a scan chain that has a safe voltage, reporting the location of all hold time faults, and creating a validating pattern for this chain to load a known state in the unsafe mode.

It is important to shift the data enough times for even the longest scan chain to be fully unloaded. Shorter chains are over shifted and therefore get padded with X (don't care) states.

This same phenomenon happens when data is shifted in and shorter chains are typically pre padded with dummy 0 data before the actual data stream. Part of our invention is to apply a background state during these pre padded input cycles.

The method of fault bit processing ameliorates a hold time defect in a scan chain.

EXAMPLE

Cells after the hold time fault must be modified (looking through an imperfect lens). Cells before the break are loaded normally.

Note that to load a 0011001100 pattern into a scan chain with a single standard hold time aggressor bit 4.

0123456789 Bit#

B0011001100B Desired Pattern

B001101100B Input Pattern

This is also true for data one and data zero sensitive hold time faults. For a data zero hold time fault 0123456789 Bit#

B0011001100B Desired Pattern

B00111101100B Input Pattern

An embodiment of the invention is an apparatus comprising a tester and a processor adapted to apply signals to a device under test according to a program tangibly embodied as instructions encoded on computer readable media according to the methods disclosed above.

Another embodiment of the invention is a method for determining if a scan chain is blocked under all environmental conditions comprising the following steps:

setting an environmental variable of the device under test wherein an environmental variable comprises at least one of temperature, supply voltage, and shift-clock-rate;

repeatedly applying a non-constant data sequence pattern to the scan input while the scan chain is in the scan shift mode;

repeatedly comparing the scan chain output data sequence pattern against the scan input pattern adjusted for the length of the scan chain;

sweeping the environmental variable through a range while repeating the steps preceding;

and recording the value of the environment variable which enables an exact match of input data sequence and output data sequence for scan chains with even parity;

and recording the value of the environment variable which enables an exact match to the inverse of input data sequence and output data sequence for scan chains with odd parity;

whereby no changing data in the scan chain output stream distinguish a chain as blocked, an exact match of input sequence and output sequence distinguish the even parity scan chain as good, an exact match of the inverse of the input sequence and output sequence distinguish the odd parity scan chain as good, and variability in matching the input data sequence and output data sequence for the even parity scan chain, and variability in matching the inverse input data sequence and output data sequence for the odd parity scan chain, distinguish the chain as potentially having defects causing hold time violations in at least one scan cell in a scan chain.

The above embodiment further includes a method for localizing a defect causing an inverting or odd-parity scan chain comprising the steps following:

setting an environmental variable to a safe value wherein a safe value is one determined to enable an exact match of input and output sequence;

applying at least one of the four phase patterns for n cycles wherein the phase patterns are 00110011, 01100110, 11001100, and 10011001, (repeating hexadecimal 3's 6's, C's and 9's);

setting the environmental variable to a value associated with a hold time violation;

clocking once;

setting the environmental variable to a safe value as before;

clocking n bits and observing m bits, wherein n is the longest chain length on the device and m is the individual chain length; and comparing applied pattern with output; whereby the bit number of non-matching bits corresponds to the position of the victim scan cell in the scan chain caused by hold time violation.

Another embodiment of the invention is a method for detecting, analyzing, and ameliorating hold time faults in a scan chain of a device under test on automated test equipment, comprising detecting a hold time error in a scan chain, changing the voltage/temperature to one level to scan in a vector at a safe voltage/temperature; and having a second (different) voltage/temperature for a safe shift out, and localizing a hold time fault in a scan chain by applying recurring hexadecimal 3's, 6's, 9's, and C's to the scan in port.

Note the sensitivity to identifying the hold-time bit when there is an inversion in the chain right at the break. Data smearing through an inversion can make an even parity scan chain into an odd parity scan chain and vice-versa.

In another embodiment of the invention the environmental variable is one of a shift frequency, a temperature, and a voltage.

CONCLUSION

The present invention creates a Real-Time interpretative Scan Pattern on the fly.

This invention includes a software architecture that can recognize the scan chain integrity pattern from the ATPG generated pattern deck and can write new data patterns based on the DUT output stimulus. The present invention localizes defects in the clock distribution system of a design for test chip which has scan chains. Specifically, hold time violations in the scan chain can be identified, counted, and localized to specific scan cell positions in the scan chain. Rather than a predefined test program for a specific device under test, the method is embodied as an adaptive process executing in the tester which configures itself to the scan architecture of the device.

The present invention is distinguished from conventional methods by the following:

Using standard ATPG Stuck-At Vectors to setup the device and put it into scan mode.

Performing the Analysis in Real-Time

Discovering and reporting a safe voltage for each chain along with the hold time violation cells which enables loading and unloading without error.

If a safe voltage does not exist, reporting the number of hold time violations for both 0 and 1 conditions.

The invention uses a method for determining if a scan chain is blocked under all environmental conditions comprising the following steps:

setting an environmental variable of the device under test wherein an environmental variable comprises at least one of temperature and supply voltage;

repeatedly applying a non-constant sequence;

observing output n clocks later wherein n is the length of the scan chain;

sweeping the environmental variable through a range while repeating the steps preceding; and recording the value of the environment variable which enables an exact match of input sequence and output sequence; whereby no changes in output distinguish as chain as blocked, an exact match of input sequence and output sequence distinguish the chain as good, and variability in matching inputs and outputs distinguish the chain as potentially having defects causing hold time violations in a scan cell in a scan chain.

The invention is distinguished by its method for localizing a defect causing a hold time violation to a scan cell in a scan chain comprising the steps following:

setting an environmental variable to a safe value wherein a safe value is one determined to enable an exact match of input and output sequence;

repeatedly applying at least one of the four phase patterns for n cycles wherein the phase patterns are 00110011, 01100110, 11001100, and 10011001, (repeating hexadecimal 3's 6's, C's and 9's);

setting the environmental variable to a value associated with a hold time violation;

clocking once;

setting the environmental variable to a safe value as before;

clocking n bits and observing m bits, wherein n is the longest chain length on the device and m is the individual chain length; and comparing applied pattern with output; whereby the bit number of non-matching bits corresponds to the position of the victim scan cell in the scan chain caused by a hold time violation.

The invention has a method for determining the number of scan cells in a scan chain having a defect causing a hold time violation comprising the steps following setting an environmental variable to a value determined to cause a potential hold time violation;

applying a pattern having a positive pulse and a negative pulse:

observing the output of the scan chain and comparing the number of clocks to the number of bits between transitions, whereby the number of hold time problems is equal to the number of clocks a transition occurs before n wherein n is the length of the scan chain.

The scope of the invention includes all modification, design variations, combinations, and equivalents that would be apparent to persons skilled in the art, and the preceding description of the invention and its preferred embodiments is not to be construed as exclusive of such.

What is claimed is:

1. A method for determining if a scan chain is blocked under all environmental conditions comprising the following steps;

setting an environmental variable of a device under test wherein the environmental variable comprises at least one of temperature and supply voltage;

repeatedly applying a non-constant sequence pattern to the device under test;

sweeping the environmental variable through a range while repeating the steps preceding;

recording a value of the environmental variable which enables a match of an input sequence to the device under test and an output sequence from the device under test, whereby no changes in the output sequence distinguishes the scan chain as broken, an exact match of the input sequence and the output sequence distinguishes the scan chain as good, and variability in matching input sequences and output sequences distinguishes the scan chain as potentially having defects causing hold time violations in at least one scan cell in the scan chain; and determining a number of scan cells in the scan chain having defects causing hold time violations by, setting the environmental variable to a value determined to cause a potential hold time violation; and then applying a pattern of 2n ones, 2n zeroes and n ones to an input of the scan chain, wherein n is the length of the scan chain; and observing an output of the scan chain and comparing a number of clocks to a number of bits between transitions, whereby the number of scan cells causing hold time violations is equal to the number of clocks that a transition occurs before n clocks.

2. The method of claim 1 further comprising a method for localizing a defect causing a hold time violation to a scan cell in the scan chain comprising the steps following:

setting the environmental variable to a safe value wherein the safe value is one determined to enable an exact match of the input and output sequences;

applying at least one of four phase patterns for n cycles wherein the phase patterns are 00110011, 01100110, 11001100, and 10011001, (repeating hexadecimal 3's 6's, C's and 9's);

setting the environmental variable to a value associated with a hold time violation;

clocking once;

setting the environmental variable to the safe value as before;

clocking n bits and observing m bits, wherein n is the longest chain length on the device and m is an individual scan chain length; and comparing the applied phase pattern with the output sequence;

whereby the bit number of non-matching bits corresponds to the position of a victim scan cell in the scan chain caused by the hold time violation.

3. An apparatus comprising a tester and a processor adapted to apply signals to a device under test according to a program tangibly embodied as instructions encoded on computer readable media according to claim 1.

4. A method for determining the number of scan cells in a scan chain having a defect causing a hold time violation comprising the steps following:

setting an environmental variable to a value determined to cause a potential hold time violation;

applying a pattern having i) background of logic zeros followed by a foreground of logic ones, and ii) a background of logic ones followed by a foreground of logic zeros;

observing the output of the scan chain and comparing a number of clocks to a number of bits between transitions, whereby the number of hold time violations is equal to the number of clocks a transition occurs before n wherein n is the length of the scan chain.

5. The method of claim 4, wherein:

the background of logic zeros followed by the foreground of logic ones is a background of 2n logic zeros followed by a foreground of n logic ones; and the background of logic ones followed by the foreground of logic zeros is a background of 2n logic ones followed by a foreground of n logic zeros.

6. A method for localizing a hold time fault in a scan chain of a device under test using automated test equipment, comprising:

using the automated test equipment, detecting a hold time fault in the scan chain of the device under test, determining a safe voltage value for loading and unloading the scan chain, and localizing the hold time fault in the scan chain by applying recurring hexadecimal 3's, 6's, 9's, and C's to an input port of the scan.

* * * * *